US008048756B2

(12) United States Patent
Lee et al.

(10) Patent No.: US 8,048,756 B2
(45) Date of Patent: *Nov. 1, 2011

(54) METHOD FOR REMOVING METAL LAYERS FORMED OUTSIDE AN APERTURE OF A BPSG LAYER UTILIZING MULTIPLE ETCHING PROCESSES INCLUDING ELECTROCHEMICAL-MECHANICAL POLISHING

(75) Inventors: Whonchee Lee, Boise, ID (US); Scott G. Meikle, Gainesville, VA (US); Guy T. Blalock, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/731,049

(22) Filed: Mar. 24, 2010

(65) Prior Publication Data
US 2010/0176083 A1 Jul. 15, 2010

Related U.S. Application Data

(62) Division of application No. 11/413,256, filed on Apr. 28, 2006, now Pat. No. 7,700,436, which is a division of application No. 10/230,628, filed on Aug. 29, 2002, now Pat. No. 7,078,308.

(51) Int. Cl.
*H01L 21/8242* (2006.01)
(52) U.S. Cl. ........................................ 438/387; 438/397
(58) Field of Classification Search .......... 438/238–239, 438/243–244, 386–387, 396–397
See application file for complete search history.

(56) References Cited

U.S. PATENT DOCUMENTS
2,315,695 A 4/1943 Faust
(Continued)

FOREIGN PATENT DOCUMENTS
EP 0459397 A2 12/1991
(Continued)

OTHER PUBLICATIONS

Aboaf, J.A., et al., IBM Technical Disclosure Bulletin, Rounding of Square-Shape Holes in Silicon Wafers, vol. 19, No. 8, p. 3042, Jan. 1977, XP-002235690, NN 77013042.

(Continued)

*Primary Examiner* — Anh Mai
(74) *Attorney, Agent, or Firm* — Perkins Coie LLP

(57) ABSTRACT

A microelectronic substrate and method for removing adjacent conductive and nonconductive materials from a microelectronic substrate. In one embodiment, the microelectronic substrate includes a substrate material (such as borophosphosilicate glass) having an aperture with a conductive material (such as platinum) disposed in the aperture and a fill material (such as phosphosilicate glass) in the aperture adjacent to the conductive material. The fill material can have a hardness of about 0.04 GPa or higher, and a microelectronics structure, such as an electrode, can be disposed in the aperture, for example, after removing the fill material from the aperture. Portions of the conductive and fill material external to the aperture can be removed by chemically-mechanically polishing the fill material, recessing the fill material inwardly from the conductive material, and electrochemically-mechanically polishing the conductive material. The hard fill material can resist penetration by conductive particles, and recessing the fill material can provide for more complete removal of the conductive material external to the aperture.

20 Claims, 6 Drawing Sheets

U.S. PATENT DOCUMENTS

| | | | |
|---|---|---|---|
| 2,516,105 A | 7/1950 | der Mateosian | |
| 3,239,439 A | 3/1966 | Helmke | |
| 3,334,210 A | 8/1967 | Williams et al. | |
| 4,613,417 A | 9/1986 | Laskowski et al. | |
| 4,839,005 A | 6/1989 | Katsumoto et al. | |
| 5,098,533 A | 3/1992 | Duke et al. | |
| 5,162,248 A | 11/1992 | Dennison et al. | |
| 5,244,534 A | 9/1993 | Yu et al. | |
| 5,300,155 A | 4/1994 | Sandhu et al. | |
| 5,344,539 A | 9/1994 | Shinogi et al. | |
| 5,562,529 A | 10/1996 | Kishii et al. | |
| 5,567,300 A | 10/1996 | Datta et al. | |
| 5,575,885 A | 11/1996 | Hirabayashi et al. | |
| 5,618,381 A | 4/1997 | Doan et al. | |
| 5,624,300 A | 4/1997 | Kishii et al. | |
| 5,676,587 A | 10/1997 | Landers et al. | |
| 5,681,423 A | 10/1997 | Sandhu et al. | |
| 5,780,358 A | 7/1998 | Zhou et al. | |
| 5,800,248 A | 9/1998 | Pant et al. | |
| 5,807,165 A | 9/1998 | Uzoh et al. | |
| 5,840,629 A | 11/1998 | Carpio | |
| 5,843,818 A | 12/1998 | Joo et al. | |
| 5,846,398 A | 12/1998 | Carpio | |
| 5,863,307 A | 1/1999 | Zhou et al. | |
| 5,888,866 A | 3/1999 | Chien | |
| 5,897,375 A | 4/1999 | Watts et al. | |
| 5,911,619 A | 6/1999 | Uzoh et al. | |
| 5,930,699 A | 7/1999 | Bhatia | |
| 5,934,980 A | 8/1999 | Koos et al. | |
| 5,952,687 A | 9/1999 | Kawakubo et al. | |
| 5,954,975 A | 9/1999 | Cadien et al. | |
| 5,954,997 A | 9/1999 | Kaufman et al. | |
| 5,972,792 A | 10/1999 | Hudson | |
| 5,993,637 A | 11/1999 | Hisamatsu et al. | |
| 6,001,730 A | 12/1999 | Farkas et al. | |
| 6,007,695 A | 12/1999 | Knall et al. | |
| 6,010,964 A | 1/2000 | Glass | |
| 6,024,856 A | 2/2000 | Haydu et al. | |
| 6,033,953 A | 3/2000 | Aoki et al. | |
| 6,039,633 A | 3/2000 | Chopra | |
| 6,046,099 A | 4/2000 | Cadien et al. | |
| 6,051,496 A | 4/2000 | Jang | |
| 6,060,386 A | 5/2000 | Givens | |
| 6,060,395 A | 5/2000 | Skrovan et al. | |
| 6,063,306 A | 5/2000 | Kaufman et al. | |
| 6,066,030 A | 5/2000 | Uzoh | |
| 6,066,559 A | 5/2000 | Gonzalez et al. | |
| 6,068,787 A | 5/2000 | Grumbine et al. | |
| 6,077,412 A | 6/2000 | Ting et al. | |
| 6,083,840 A | 7/2000 | Mravic et al. | |
| 6,100,197 A | 8/2000 | Hasegawa | |
| 6,103,096 A | 8/2000 | Datta et al. | |
| 6,103,628 A | 8/2000 | Talieh | |
| 6,103,636 A | 8/2000 | Zahorik et al. | |
| 6,115,233 A | 9/2000 | Seliskar et al. | |
| 6,117,781 A | 9/2000 | Lukanc et al. | |
| 6,121,152 A | 9/2000 | Adams et al. | |
| 6,132,586 A | 10/2000 | Adams et al. | |
| 6,143,155 A | 11/2000 | Adams et al. | |
| 6,162,681 A | 12/2000 | Wu | |
| 6,171,467 B1 | 1/2001 | Weihs et al. | |
| 6,174,425 B1 | 1/2001 | Simpson et al. | |
| 6,176,992 B1 | 1/2001 | Talieh | |
| 6,180,947 B1 | 1/2001 | Stickel et al. | |
| 6,187,651 B1 | 2/2001 | Oh | |
| 6,190,494 B1 | 2/2001 | Dow | |
| 6,196,899 B1 | 3/2001 | Chopra et al. | |
| 6,197,182 B1 | 3/2001 | Kaufman et al. | |
| 6,206,756 B1 | 3/2001 | Chopra et al. | |
| 6,218,309 B1 | 4/2001 | Miller et al. | |
| 6,250,994 B1 | 6/2001 | Chopra et al. | |
| 6,259,128 B1 | 7/2001 | Adler et al. | |
| 6,273,786 B1 | 8/2001 | Chopra et al. | |
| 6,276,996 B1 | 8/2001 | Chopra | |
| 6,280,581 B1 | 8/2001 | Cheng | |
| 6,287,974 B1 | 9/2001 | Miller | |
| 6,299,741 B1 | 10/2001 | Sun et al. | |
| 6,303,956 B1 | 10/2001 | Sandhu et al. | |
| 6,313,038 B1 | 11/2001 | Chopra et al. | |
| 6,322,422 B1 | 11/2001 | Satou | |
| 6,328,632 B1 | 12/2001 | Chopra | |
| 6,338,669 B1 | 1/2002 | Togawa et al. | |
| 6,368,184 B1 | 4/2002 | Beckage | |
| 6,368,190 B1 | 4/2002 | Easter et al. | |
| 6,379,223 B1 | 4/2002 | Sun et al. | |
| 6,395,152 B1 | 5/2002 | Wang | |
| 6,395,607 B1 | 5/2002 | Chung | |
| 6,416,647 B1 | 7/2002 | Dordi et al. | |
| 6,433,929 B1 | 8/2002 | Sasaki et al. | |
| 6,451,663 B1 | 9/2002 | Choi et al. | |
| 6,455,370 B1 | 9/2002 | Lane | |
| 6,461,911 B2 | 10/2002 | Ahn et al. | |
| 6,464,855 B1 | 10/2002 | Chadda et al. | |
| 6,504,247 B2 | 1/2003 | Chung | |
| 6,515,493 B1 | 2/2003 | Adams et al. | |
| 6,537,144 B1 | 3/2003 | Tsai et al. | |
| 6,551,935 B1 | 4/2003 | Sinha et al. | |
| 6,599,806 B2 | 7/2003 | Lee | |
| 6,602,117 B1 | 8/2003 | Chopra et al. | |
| 6,603,117 B2 | 8/2003 | Corrado et al. | |
| 6,605,539 B2 | 8/2003 | Lee et al. | |
| 6,607,988 B2 | 8/2003 | Yunogami et al. | |
| 6,620,037 B2 | 9/2003 | Kaufman et al. | |
| 6,632,335 B2 | 10/2003 | Kunisawa et al. | |
| 6,689,258 B1 | 2/2004 | Lansford et al. | |
| 6,693,036 B1 | 2/2004 | Nogami et al. | |
| 6,705,926 B2 | 3/2004 | Zhou et al. | |
| 6,722,942 B1 | 4/2004 | Lansford et al. | |
| 6,722,950 B1 | 4/2004 | Dabral et al. | |
| 6,726,823 B1 | 4/2004 | Wang et al. | |
| 6,736,952 B2 | 5/2004 | Emesh et al. | |
| 6,753,250 B1 | 6/2004 | Hill et al. | |
| 6,776,693 B2 | 8/2004 | Duboust et al. | |
| 6,780,772 B2 | 8/2004 | Uzoh et al. | |
| 6,797,623 B2 | 9/2004 | Sato et al. | |
| 6,808,617 B2 | 10/2004 | Sato et al. | |
| 6,811,680 B2 | 11/2004 | Chen et al. | |
| 6,846,227 B2 | 1/2005 | Sato et al. | |
| 6,848,970 B2 | 2/2005 | Manens et al. | |
| 6,852,630 B2 | 2/2005 | Basol et al. | |
| 6,858,124 B2 | 2/2005 | Zazzera et al. | |
| 6,867,136 B2 | 3/2005 | Basol et al. | |
| 6,867,448 B1 | 3/2005 | Lee et al. | |
| 6,881,664 B2 | 4/2005 | Catabay et al. | |
| 6,884,338 B2 | 4/2005 | Kesari et al. | |
| 6,893,328 B2 | 5/2005 | So | |
| 6,899,804 B2 | 5/2005 | Duboust et al. | |
| 6,951,599 B2 | 10/2005 | Yahalom et al. | |
| 6,977,224 B2 | 12/2005 | Dubin et al. | |
| 7,074,113 B1 | 7/2006 | Moore | |
| 7,078,308 B2 | 7/2006 | Lee et al. | |
| 7,094,131 B2 | 8/2006 | Lee et al. | |
| 7,112,121 B2 | 9/2006 | Lee et al. | |
| 7,112,122 B2 | 9/2006 | Lee et al. | |
| 7,129,160 B2 | 10/2006 | Chopra | |
| 7,134,934 B2 | 11/2006 | Lee et al. | |
| 7,153,195 B2 | 12/2006 | Lee et al. | |
| 7,153,410 B2 | 12/2006 | Moore et al. | |
| 7,153,777 B2 | 12/2006 | Lee | |
| 7,160,176 B2 | 1/2007 | Lee et al. | |
| 7,192,335 B2 | 3/2007 | Lee et al. | |
| 7,220,166 B2 | 5/2007 | Lee et al. | |
| 7,229,535 B2 | 6/2007 | Wang et al. | |
| 7,524,410 B2 | 4/2009 | Lee et al. | |
| 7,566,391 B2 | 7/2009 | Lee et al. | |
| 2001/0006245 A1 | 7/2001 | Yunogami et al. | |
| 2001/0025976 A1 | 10/2001 | Lee | |
| 2001/0035354 A1 | 11/2001 | Ashjaee et al. | |
| 2001/0036746 A1 | 11/2001 | Sato et al. | |
| 2002/0052126 A1 | 5/2002 | Lee et al. | |
| 2002/0070126 A1 | 6/2002 | Sato et al. | |
| 2002/0086487 A1 | 7/2002 | Chung | |
| 2002/0104764 A1 | 8/2002 | Banerjee et al. | |
| 2002/0108861 A1 | 8/2002 | Emesh et al. | |
| 2002/0115283 A1 | 8/2002 | Ho et al. | |
| 2003/0064669 A1 | 4/2003 | Basol et al. | |
| 2003/0113996 A1 | 6/2003 | Nogami et al. | |

| | | | |
|---|---|---|---|
| 2003/0116446 | A1 | 6/2003 | Duboust et al. |
| 2003/0127320 | A1 | 7/2003 | Emesh et al. |
| 2003/0178320 | A1 | 9/2003 | Liu et al. |
| 2003/0234184 | A1 | 12/2003 | Liu et al. |
| 2004/0009668 | A1 | 1/2004 | Catabay et al. |
| 2004/0154931 | A1 | 8/2004 | Hongo et al. |
| 2004/0192052 | A1 | 9/2004 | Mukherjee et al. |
| 2004/0214510 | A1 | 10/2004 | So |
| 2004/0259479 | A1 | 12/2004 | Sevilla |
| 2005/0016861 | A1 | 1/2005 | Laursen et al. |
| 2005/0056550 | A1 | 3/2005 | Lee et al. |
| 2005/0133379 | A1 | 6/2005 | Basol et al. |
| 2005/0173260 | A1 | 8/2005 | Basol et al. |
| 2005/0178743 | A1 | 8/2005 | Manens et al. |
| 2006/0163083 | A1 | 7/2006 | Andricacos et al. |
| 2006/0199351 | A1 | 9/2006 | Lee et al. |
| 2006/0208322 | A1 | 9/2006 | Lee et al. |

FOREIGN PATENT DOCUMENTS

| | | |
|---|---|---|
| EP | 1123956 A1 | 8/2001 |
| EP | 1536919 A1 | 6/2005 |
| JP | 1241129 A | 9/1989 |
| JP | 6120182 A | 4/1994 |
| JP | 10335305 A | 12/1998 |
| JP | 11145273 A | 5/1999 |
| JP | 2000269318 A | 9/2000 |
| JP | 2001077117 A | 3/2001 |
| JP | 2002093758 A | 3/2002 |
| TW | 516471 B | 1/2003 |
| WO | 0026443 A2 | 5/2000 |
| WO | 0028586 A2 | 5/2000 |
| WO | 0032356 A1 | 6/2000 |
| WO | 0059008 A2 | 10/2000 |
| WO | 0059682 A1 | 10/2000 |
| WO | 02064314 A1 | 8/2002 |
| WO | 02085570 A2 | 10/2002 |
| WO | 03028048 A2 | 4/2003 |
| WO | 03072672 A1 | 9/2003 |

OTHER PUBLICATIONS

ATMI, Inc., adapted from a presentation at the Semicon West '99 Low Dielectric Materials Technology Conference, San Francisco, California, Jul. 12, 1999, pp. 13-25.

Bassous, E., IBM Technical Disclosure Bulletin, Low Temperature Methods for Rounding Silicon Nozzles, vol. 20, No. 2, Jul. 1977, pp. 810-811, XP-002235692, NN 7707810.

Bernhardt, A.F., et al., "Electrochemical Planarization for Multi-Level Metallization of Microcircuitry," CircuiTree, vol. 8, No. 10, pp. 38, 40, 42, 44, 46, and 48, Oct. 1995.

D'Heurle, F.M., et al., IBM Technical Disclosure Bulletin, Electrolytic Process for Metal Pattern Generation, vol. 17, No. 1, pp. 271-272, Jun. 1974, XP-002235691, NN 7406271.

Frankenthal, R.P., et al., "Electroetching of Platinum in the Titanium-Platinum-Gold Metallization Silicon Integrated Circuits," Journal of The Electrochemical Society, vol. 123, No. 5, pp. 703-706, May 1976, Pennington, New Jersey.

Huang, C.S. et al., "A Novel UV Baking Process to Improve DUV Photoresist Hardness," pp. 135-138, Proceedings of the 1999 International Symposium, VLSI Technology, Systems, and Applications: Proceedings of Technical Papers: Jun. 8-10, 1999, Taipei, Taiwan, Institute of Electrical and Electronics Engineers, Inc., Sep. 1999.

Juchniewicz, R. et al. "Influence of Pulsed Current Plantinised Titanium and Tantalum Anode Durability," International Congress Metallic Corrosion, Proceedings—vol. 3, pp. 449-453, Toronto, Jun. 3-7, 1984.

Kondo, S. et al., "Abrasive-Free Polishing for Copper Damascene Interconnection," Journal of the Electrochemical Society, vol. 147, No. 10, pp. 3907-3913, The Electrochemical Society, Inc., Pennington, New Jersey, 2000.

McGraw-Hill, "Chemical bonding," Concise Encyclopedia of Science & Technology, Fourth Edition, Sybil P. Parker, Editor in Chief, p. 367, McGraw-Hill, New York, 1998.

Micro Photonics, Inc. CSM Application Bulletin. Low-load Micro Scratch Tester (MST) for characterization of thin polymer films [online], 3 pages, retrieved from the Internet Jul. 25, 2002. <http://www.microphotonics.com/mstABpoly.html>.

Micro Photonics, Inc. CSM Nano Hardness Tester [online], 6 pages, retrieved from the Internet Jul. 29, 2002. <http://www.microphotonics.com/nht.html>.

PhysicsWorld. Hard Materials (excerpt of Superhard superlattices) [online], S. Barnett and A. Madan, Physics World, Jan. 1998, Institute of Physics Publishing Ltd., Bristol, United Kingdom, retrieved from the Internet, Jul. 29, 2002 <http://physicsweb.org/box/world/11/1/11/world-11-1-11-1>.

Wolf, S. et al., Silicon Processing for the VLSI Era, vol. 1, Lattice Press, 1986, pp. 188-189.

METHOD FOR REMOVING METAL LAYERS FORMED OUTSIDE AN APERTURE OF A BPSG LAYER UTILIZING MULTIPLE ETCHING PROCESSES INCLUDING ELECTROCHEMICAL-MECHANICAL POLISHING

CROSS-REFERENCE TO RELATED APPLICATIONS

This application is a divisional of U.S. application Ser. No. 11/413,256 filed Apr. 28, 2006, now U.S. Pat. No. 7,700,436, which is a divisional of U.S. application Ser. No. 10/230,628 filed Aug. 29, 2002, now U.S. Pat. No. 7,078,308, both of which are incorporated herein by reference.

This application is related to the following U.S. patent applications, all of which are incorporated herein by reference: U.S. Ser. No. 09/651,779 filed Aug. 30, 2000, now U.S. Pat. No. 7,074,113; U.S. Ser. No. 09/888,084 filed Jun. 21, 2001, now U.S. Pat. No. 7,112,121; U.S. Ser. No. 09/887,767 filed Jun. 21, 2001, now U.S. Pat. No. 7,094,131; U.S. Ser. No. 09/888,002 filed Jun. 21, 2001, now U.S. Pat. No. 7,160,176; U.S. Ser. No. 10/230,970 filed Aug. 29, 2002, now U.S. Pat. No. 7,220,166; U.S. Ser. No. 10/230,972 filed Aug. 29, 2002, now U.S. Pat. No. 7,134,934; U.S. Ser. No. 10/230,973 filed Aug. 29, 2002, now U.S. Pat. No. 7,153,195; U.S. Ser. No. 10/230,463 filed Aug. 29, 2002, now U.S. Pat. No. 7,192,335; and U.S. Ser. No. 11/413,286 filed Apr. 28, 2006, now abandoned.

TECHNICAL FIELD

The present invention relates generally to methods and apparatuses for removing adjacent conductive and nonconductive materials of a microelectronic substrate.

BACKGROUND

Microelectronic substrates and substrate assemblies typically include a semiconductor material having features, such as memory cells, that are linked with conductive lines. The conductive lines can be formed by first forming trenches or other recesses in the semiconductor material and then overlaying a conductive material (such as a metal) in the trenches. The conductive material is then selectively removed to leave conductive lines extending from one feature in the semiconductor material to another.

One technique for forming microelectronic features, such as capacitors, is to dispose the features in isolated containers within the microelectronic substrate. One typical process includes forming an aperture in a substrate material (such as borophosphosilicate glass or BPSG), coating the microelectronic substrate (including the walls of the aperture) first with a barrier layer and then with a conductive layer, and then overfilling the aperture with a generally nonconductive material, such as a photoresist material. The excess photoresist material, conductive layer material, and barrier layer material located external to the aperture are then removed using chemical-mechanical planarization or polishing (CMP). The capacitor is then disposed within the photoresist material in the aperture and coupled to other features of the microelectronic substrate with an overlying network of vias and lines.

One drawback with the foregoing container technique for forming capacitors is that during the CMP process, small particles of the conductive material removed from the conductive layer can become embedded in the photoresist material within the aperture. The embedded conductive material can cause short circuits and/or other defects in the capacitor that is subsequently formed in the aperture, causing the capacitor to fail.

SUMMARY

The present invention is directed toward methods and apparatuses for removing adjacent conductive and nonconductive materials of a microelectronic substrate. A method in accordance with one aspect of the invention includes forming an aperture in a microelectronic substrate material, disposing a conductive material in the aperture proximate to a wall of the aperture, and disposing a fill material in the aperture proximate to the conductive material. In one aspect of this embodiment, the fill material has a hardness of about 0.04 GPa or higher, and in another aspect of the invention, the fill material has a hardness of about 6.5 GPa or higher. For example, the fill material can include a phosphosilicate glass or a spin-on glass. A microelectronic feature, such as an electrode, can then be disposed in the aperture.

A method in accordance with another aspect of the invention includes providing a microelectronic substrate having a substrate material defining a substrate material plane, a conductive material proximate to the substrate material, and a generally nonconductive material proximate to the conductive material. The conductive material is accordingly positioned between the substrate material and the generally nonconductive material. A portion of the generally nonconductive material includes a first external portion projecting beyond the substrate material plane, and a portion of the conductive material includes a second external portion projecting beyond the substrate material plane. At least part of the first external portion extending beyond the second external portion is removed, and the fill material is recessed inwardly toward the substrate material plane. At least part of the second external portion is also removed. For example, the first external portion can be removed via chemical-mechanical polishing, and the second external portion can be removed via electrochemical-mechanical polishing. In a further aspect of the invention, the first external portion can be recessed until it extends outwardly from the substrate material plane by distance from about 200 Å to about 500 Å.

DETAILED DESCRIPTION

The present disclosure describes methods and apparatuses for processing microelectronic substrates. Many specific details of certain embodiments of the invention are set forth in the following description and in FIGS. 1A-5 to provide a thorough understanding of these embodiments. One skilled in the art, however, will understand that the present invention may have additional embodiments and that the invention may be practiced without several of the details described below.

Figure 1A:
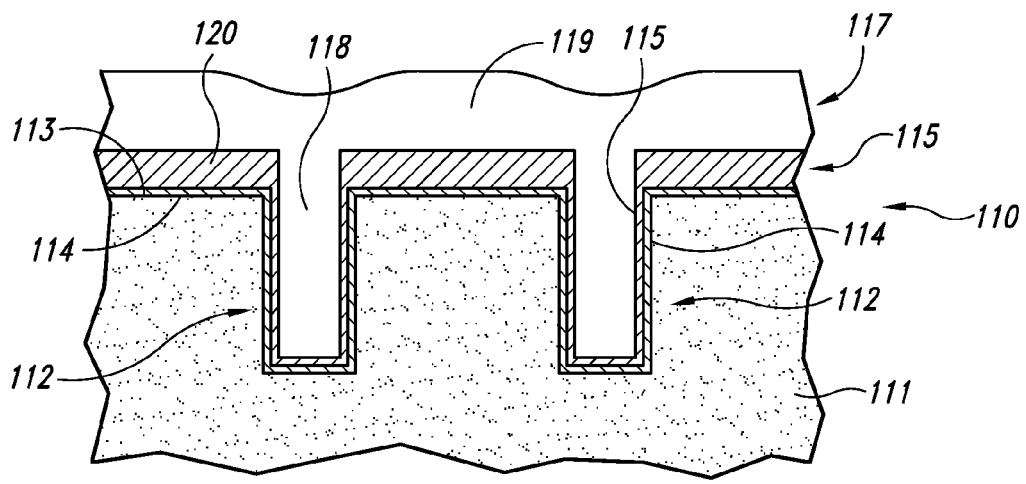
FIGS. 1A-1F schematically illustrate a process for forming features in a microelectronic substrate in accordance with an embodiment of the invention.

FIG. 1A is a partially schematic illustration of a microelectronic substrate 110 positioned for processing in accordance with an embodiment of the invention. In one aspect of this embodiment, the microelectronic substrate 110 includes a substrate material 111, such as borophosphosilicate glass (BPSG), and in other embodiments, the microelectronic substrate 110 can include other substrate materials 111, such as undoped silicon dioxide. In any of these embodiments, one or more apertures 112 (two of which are shown in FIG. 1A) can be formed in a substrate material plane 113 of the substrate material 111, using conventional techniques such as patterned etching. In one embodiment, the apertures 112 have a relatively high aspect ratio (i.e., depth-to-width ratio). For example, in one particular embodiment, the apertures 112 can have an aspect ratio of about 4:1 or more, and in other embodiments, the apertures 112 can have other aspect ratios. In any of these embodiments, an underlayer 114 (such as tantalum or tantalum oxide) can be disposed on the substrate material plane 113 and adjacent to the walls of the apertures 112. The underlayer 114 can be disposed on the microelectronic substrate 110 using conventional techniques, such as physical vapor deposition (PVD) or chemical vapor deposition (CVD). In one aspect of this embodiment, the underlayer 114 can form a barrier layer and in other embodiments, the underlayer 114 can perform other functions, such as promoting adhesion of subsequently deposited materials onto the walls of the apertures 112.

A layer of conductive material 115 is then disposed on the underlayer 114. In one embodiment, the conductive material 115 can include platinum or platinum alloys, and in other embodiments, the conductive material 115 can include other electrically conductive constituents, such as rhodium, ruthenium, copper or alloys of these materials. Platinum may be particularly suitable for apertures 112 having high aspect ratios, such as aspect ratios of approximately 4:1 or more.

A fill material 117 is then disposed on the conductive material 115. The fill material 117 includes subplane portions 118 (positioned beneath the substrate material plane 113 in the apertures 112) and a first external portion 119 that extends outwardly away from the substrate material plane 113, external to the apertures 112. The first external portion 119 is disposed on a second external portion 120 defined by the part of the conductive material 115 located external to the apertures 112 and beyond the substrate material plane 113.

In one embodiment, the fill material 117 can include a relatively hard, generally nonconductive substance, such as phosphosilicate glass (PSG). In a specific aspect of this embodiment, the fill material 117 can include PSG having 6% phosphorous. In other embodiments, the fill material 117 can include other relatively hard PSG or non-PSG materials, such as spin-on glass (SOG). In any of these embodiments, the fill material 117 has a hardness greater than that of a typical photoresist material. Accordingly, in one particular embodiment, the fill material 117 can have a hardness of about 0.04 GPa or higher. In one aspect of this embodiment, the hardness is calculated by driving an indenter with a known geometry into the material and measuring the normal applied force as a function of displacement. In other embodiments, the hardness is calculated in accordance with other methods. In a particular embodiment in which the fill material 117 includes 6% phosphorous PSG, the fill material 117 can have a hardness of about 6.5 GPa or higher. In any of these embodiments, the relatively hard composition of the fill material 117 can resist penetration from particles of the conductive material 115, as described in greater detail below.

Figure 1B:
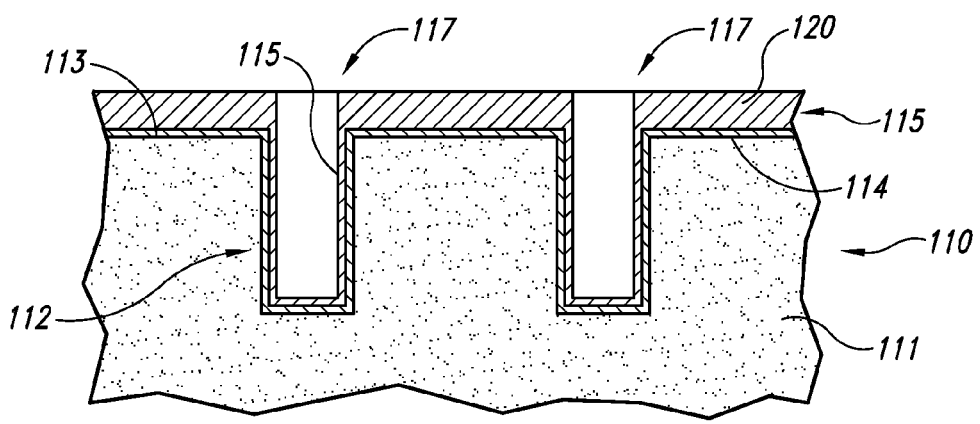

The first external portion 119 of the fill material 117 can be removed (as shown in FIG. 1B) so that the remaining fill material 117 is flush with the conductive material 115. In one aspect of this embodiment, conventional CMP techniques and slurries are used to remove the first projection 119. Apparatuses for removing the first projection 119 are described in greater detail below with reference to FIGS. 2-5.

Figure 1C:
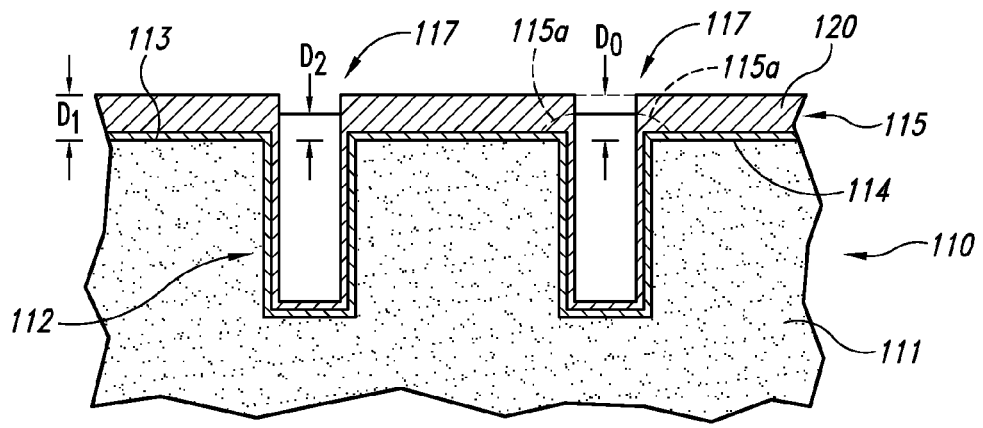

As shown in FIG. 1C, a portion of the remaining fill material 117 can be recessed relative to the adjacent conductive material 115 prior to removing the adjacent conductive material 115. For example, when the conductive material 115 projects away from the substrate material plane 113 by a distance $D_1$, the remaining fill material 117 can project by distance $D_2$ (less than $D_1$) from the substrate material plane 113. In one particular embodiment, where $D_1$ is approximately 1,000 Å, $D_2$ can be from about 200 Å to about 500 Å. In other embodiments, the relative values of $D_1$ and $D_2$ can be different, so long as $D_2$ is less than $D_1$. For example, the recess distance (e.g., $D_1$ minus $D_2$) can be from about 50% to about 80% of $D_1$. In any of these embodiments, selective etch techniques can be used to selectively recess the fill material 117 relative to the adjacent second external portion 120 of the conductive material 115. The second external portion 120 is then removed, as described below.

Figure 1D:
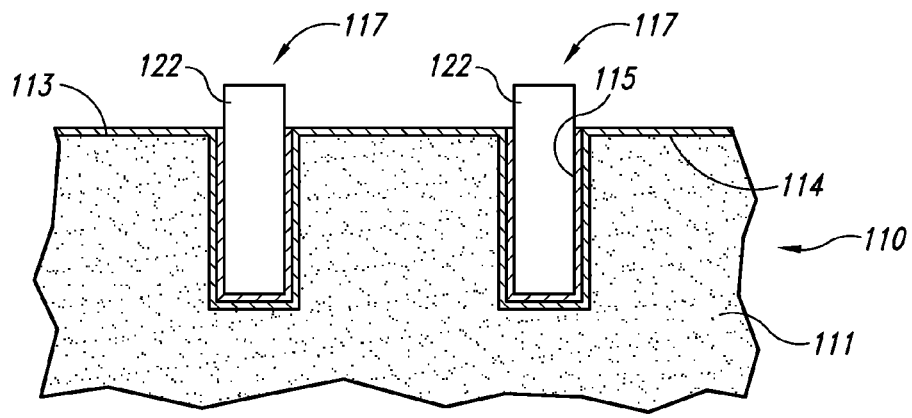

FIG. 1D is a schematic illustration of the microelectronic substrate 110 after the second external portion 120 (FIG. 1C) of the conductive material 115 has been removed. The second external portion 120 can be removed using electrochemical-mechanical polishing (ECMP) techniques and an apparatus generally similar to that described in greater detail below with reference to FIGS. 2-5. In one aspect of this embodiment, the removal of the conductive material 115 is halted upon exposing the underlayer 114. In a further aspect of this embodiment, the conductive material 115 is removed more rapidly than is the fill material 117, so that projections 122 of the fill material 117 extend outwardly from the substrate material plane 113 at the end of this phase of processing. For example, during ECMP processing, the conductive material 115 is removed electrolytically, as well as by chemical and/or mechanical action, whereas the generally nonconductive fill material 117 is removed without electrolytic action. As will be described in greater detail below with reference to FIG. 1E, the projections 122 of the fill material 117 are removed in a subsequent step.

One aspect of an embodiment of the process described above with reference to FIGS. 1C and 1D is that the fill material 117 is recessed relative to the adjacent conductive material 115 by a selected distance prior to removing the adjacent conductive material 115. One advantage of this process is that recessing the fill material 117 can reduce the likelihood for forming residual deposits of conductive material 115 around the apertures 112. For example, if the fill material 117 is flush with the second projection 120 (as indicated by distance $D_0$ in FIG. 1C) when the conductive material 115 is removed, the resulting large mass of fill material 117 extending away from the substrate material plane 113 can "shield" the adjacent conductive material 115 and reduce the effectiveness of the ECMP process for removing the conductive material 115. Accordingly, the process can leave residual deposits 115a of the conductive material 115 around the apertures 112, as shown in dashed lines in FIG. 1D. These deposits, if not removed, can cause short-circuits with adjacent structures, and/or can adversely affect subsequent processing steps. Conversely, if the fill material 117 is recessed substantially lower than the distance $D_2$, the fill material 117 may not adequately support the conducive material 115 within the apertures 112 during the ECMP and CMP processes, causing the conductive material 115 to shear out of the apertures 112 during processing.

Figure 1E:
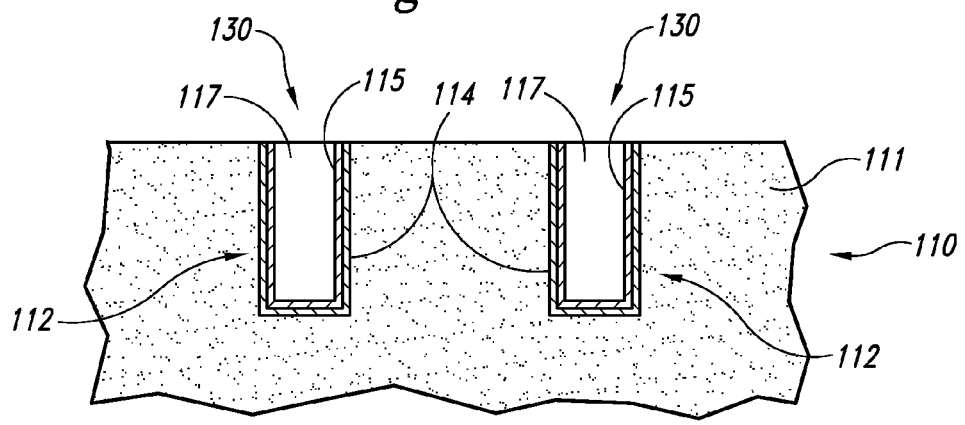

The projections 122 of the fill material 117, along with the portions of the underlayer 114 and the conductive material 115 extending out of the apertures 112, are then removed to form the containers 130, as shown in FIG. 1E. Accordingly, each container 130 includes a volume of fill material 117 surrounded by a layer of conductive material 115, which is in turn surrounded by the underlayer 114. At this point, each container 130 is electrically isolated and shielded from the surrounding structures in the microelectronic substrate 110.

Figure 1F:
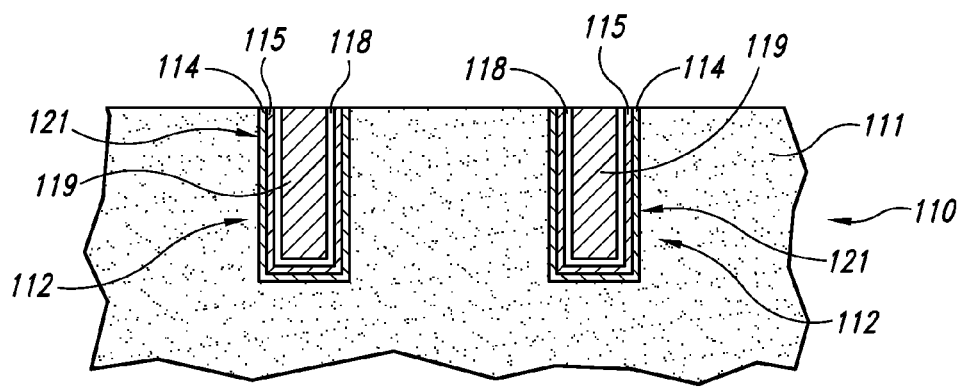

As shown in FIG. 1F, further features (such as electrodes) can next be disposed in the containers 130 to form structures 121 such as capacitors. The features can be disposed in the containers 130 using conventional techniques (such as selective etching and deposition) and are electrically coupled to each other and/or to external contacts with a network of vias and/or lines, also formed with conventional techniques, such as damascene techniques. For example, in one embodiment, the remaining fill material 117 within the apertures 112 is removed. A film 118, formed from a material such as tantalum pentoxide, is then disposed in the apertures 112, and a conductive electrode 119 is disposed adjacent to the film 118 to form the capacitor. In other embodiments, the foregoing techniques can be used to form other features in the microelectronic substrate 110, such as trenches and/or conductive lines. In any of these embodiments, portions of the microelectronic substrate 110 can then be diced from the larger wafer of which they are a part for encapsulation and incorporation in electronic devices.

Figure 2:
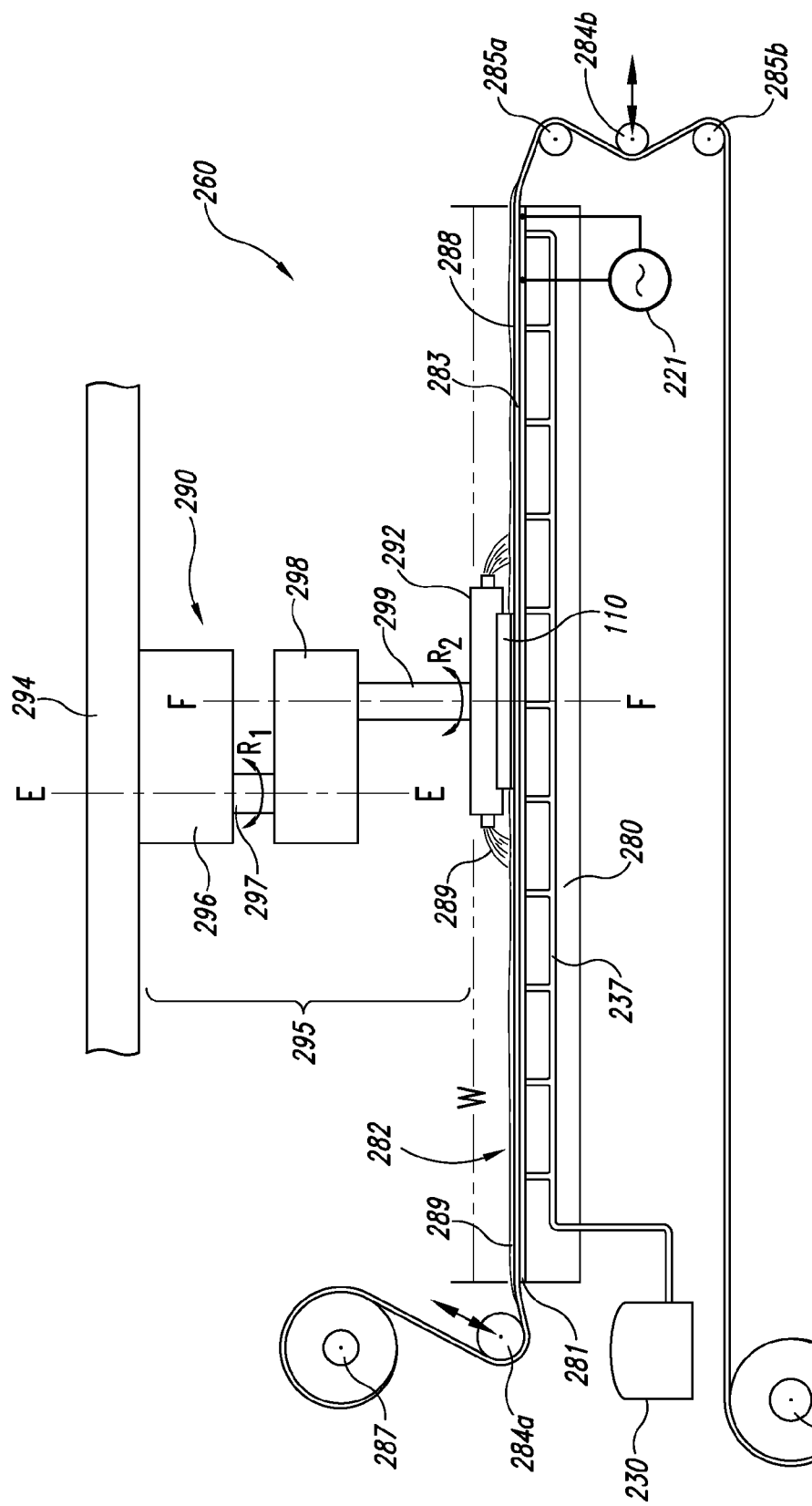
FIG. 2 is a partially schematic illustration of an apparatus for carrying out processes in accordance with embodiments of the invention.

FIGS. 2-5 schematically illustrate apparatuses for processing the microelectronic substrate 110 in a manner generally similar to that described above with reference to FIGS. 1A-1F. For example, FIG. 2 schematically illustrates an apparatus 260 chemically-mechanically and/or electrochemically-mechanically polishing the microelectronic substrate 110 in accordance with an embodiment of the invention. In one aspect of this embodiment, the apparatus 260 has a support table 280 with a top-panel 281 at a workstation where an operative portion "W" of a polishing pad 283 is positioned. The top-panel 281 is generally a rigid plate to provide a flat, solid surface to which a particular section of the polishing pad 283 may be secured during polishing.

The apparatus 260 can also have a plurality of rollers to guide, position and hold the polishing pad 283 over the top-panel 281. The rollers can include a supply roller 287, first and second idler rollers 284a and 284b, first and second guide rollers 285a and 285b, and a take-up roller 286. The supply roller 287 carries an unused or preoperative portion of the polishing pad 283, and the take-up roller 286 carries a used or postoperative portion of the polishing pad 283. Additionally, the first idler roller 284a and the first guide roller 285a can stretch the polishing pad 283 over the top-panel 281 to hold the polishing pad 283 stationary during operation. A motor (not shown) drives at least one of the supply roller 287 the take-up roller 286 to sequentially advance the polishing pad 283 across the top-panel 281. Accordingly, clean preoperative sections of the polishing pad 283 may be quickly substituted for used sections to provide a consistent surface for polishing and/or cleaning the microelectronic substrate 110.

The apparatus 260 can also have a carrier assembly 290 that controls and protects the microelectronic substrate 110 during polishing. The carrier assembly 290 can include a substrate holder 292 to pick up, hold and release the substrate 110 at appropriate stages of the polishing process. The carrier assembly 290 can also have a support gantry 294 carrying a drive assembly 295 that can translate along the gantry 294. The drive assembly 295 can have an actuator 296, a drive shaft 297 coupled to the actuator 296, and an arm 298 projecting from the drive shaft 297. The arm 298 carries the substrate holder 292 via a terminal shaft 299 such that the drive assembly 295 orbits the substrate holder 292 about an axis E-E (as indicated by arrow "$R_1$"). The terminal shaft 299 may also rotate the substrate holder 292 about its central axis F-F (as indicated by arrow "$R_2$").

The polishing pad 283 and a polishing liquid 289 define a polishing medium 282 that mechanically and/or chemically-mechanically removes material from the surface of the microelectronic substrate 110. The polishing pad 283 used in the apparatus 260 can be a fixed-abrasive polishing pad in which abrasive particles are fixedly bonded to a suspension medium. Accordingly, the polishing solution 289 can be a "clean solution" without abrasive particles because the abrasive particles are fixedly distributed across a polishing surface 288 of the polishing pad 283. In other applications, the polishing pad 283 may be a nonabrasive pad without abrasive particles, and the polishing solution 289 can be a slurry with abrasive particles and chemicals to remove material from the microelectronic substrate 110. To polish the microelectronic substrate 110 with the apparatus 260, the carrier assembly 290 presses the microelectronic substrate 110 against the polishing surface 288 of the polishing pad 283 in the presence of the polishing solution 289. The drive assembly 295 then orbits the substrate holder 292 about the axis E-E and optionally rotates the substrate holder 292 about the axis F-F to translate the substrate 110 across the polishing surface 288. As a result, the abrasive particles and/or the chemicals in the polishing medium 282 remove material from the surface of the microelectronic substrate 110 in a chemical and/or chemical-mechanical polishing process.

In a further aspect of this embodiment, the polishing solution 289 can include an electrolyte for ECMP processing. In another embodiment, the apparatus 260 can include an electrolyte supply vessel 230 that delivers an electrolyte separately to the polishing surface 288 of the polishing pad 283 with a conduit 237, as described in greater detail below with reference to FIG. 3. In either embodiment, the apparatus 260 can further include a current supply 221 coupled to electrodes positioned proximate to the polishing pad 283. Accordingly, the apparatus 260 can electrolytically remove material from the microelectronic substrate 110.

Figure 3:
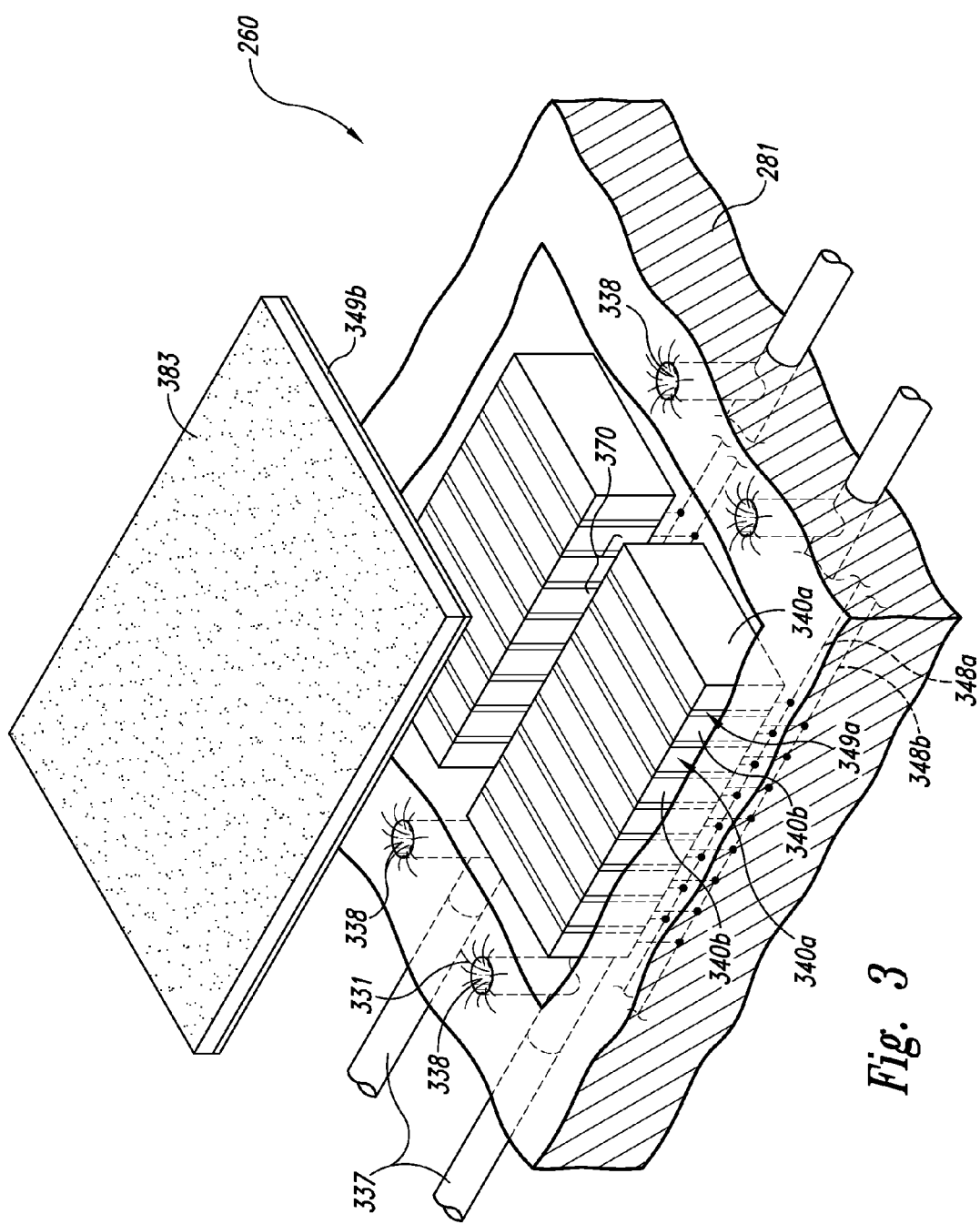
FIG. 3 is a partially schematic, isometric view of a portion of the apparatus shown in FIG. 2 in accordance with an embodiment of the invention.

FIG. 3 is a partially exploded, partially schematic isometric view of a portion of the apparatus 260 described above with reference to FIG. 2. In one aspect of the embodiment shown in FIG. 3, the top-panel 281 houses a plurality of electrode pairs 370, each of which includes a first electrode 340a and a second electrode 340b. The first electrodes 340a are coupled to a first lead 348a and the second electrodes 340b are coupled to a second lead 348b. The first and second leads 348a and 348b are coupled to the current supply 241 (FIG. 2). In one aspect of this embodiment, the first electrodes 340a can be separated from the second electrodes 340b by an electrode dielectric layer 349a that includes Teflon™ or another suitable dielectric material. The electrode dielectric layer 349a can accordingly control the volume and dielectric constant of the region between the first and second electrodes 340a and 340b to control the electrical coupling between the electrodes.

The electrodes 340a and 340b can be electrically coupled to the microelectronic substrate 110 (FIG. 2) by the polishing pad 283. In one aspect of this embodiment, the polishing pad 283 is saturated with an electrolyte 331 supplied by the supply conduits 337 through apertures 338 in the top-panel 281 just beneath the polishing pad 283. Accordingly, the electrodes 320a and 320b are selected to be compatible with the electrolyte 331. In an another arrangement, the electrolyte 331 can be supplied to the polishing pad 283 from above (for example, by disposing the electrolyte 331 in the polishing liquid 289, rather than by directing the electrolyte upwardly through the polishing pad 283). Accordingly, the apparatus 260 can include a pad dielectric layer 349b (FIG. 2) positioned between the polishing pad 283 and the electrodes 340a and 340b. When the pad dielectric layer 349b is in place, the electrodes 340a and 340b are isolated from physical contact with the electrolyte 331 and can accordingly be selected from materials that are not necessarily compatible with the electrolyte 331.

Figure 4:
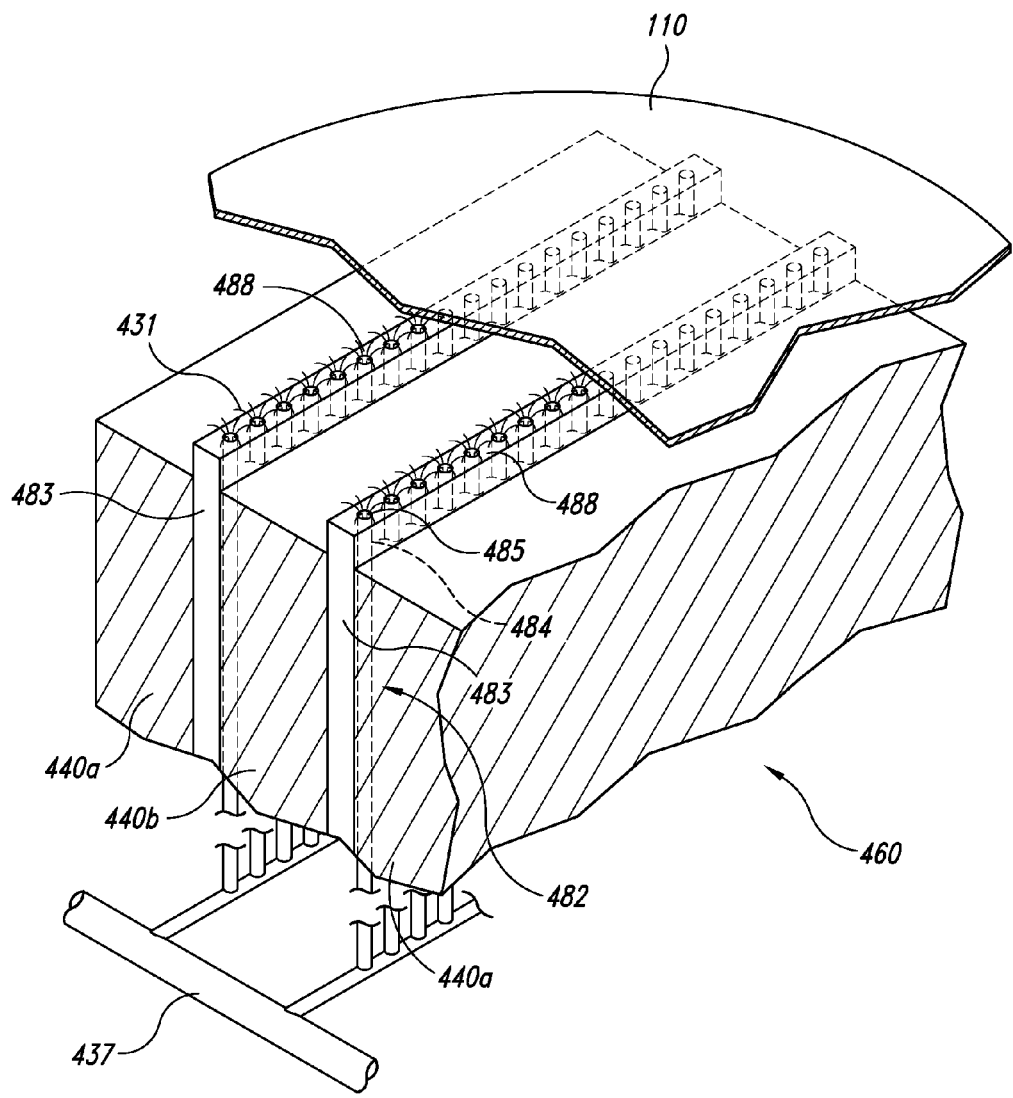
FIG. 4 is a partially schematic, side elevation view of an apparatus for processing a microelectronic substrate in accordance with another embodiment of the invention.

FIG. 4 is an isometric view of a portion of an apparatus 460 having electrodes 440 (shown as a first electrode 440a and a second electrode 440b), and a polishing medium 482 arranged in accordance with another embodiment of the invention. In one aspect of this embodiment, the polishing medium 482 includes polishing pad portions 483 that project beyond the electrodes 440a and 440b. Each polishing pad portion 483 can include a polishing surface 488 and a plurality of flow passages 484 coupled to a fluid source (not shown in FIG. 4) with a conduit 437. Each flow passage 484 can have an aperture 485 proximate to the polishing surface 488 to provide an electrolyte 431 proximate to an interface between the microelectronic substrate 110 and the polishing surface 488. In one aspect of this embodiment, the pad portions 483 can include recesses 487 surrounding each aperture 485. Accordingly, the electrolyte 431 can proceed outwardly from the flow passages 484 while the microelectronic substrate 110 is positioned directly overhead and remains spaced apart from the electrodes 420.

Figure 5:
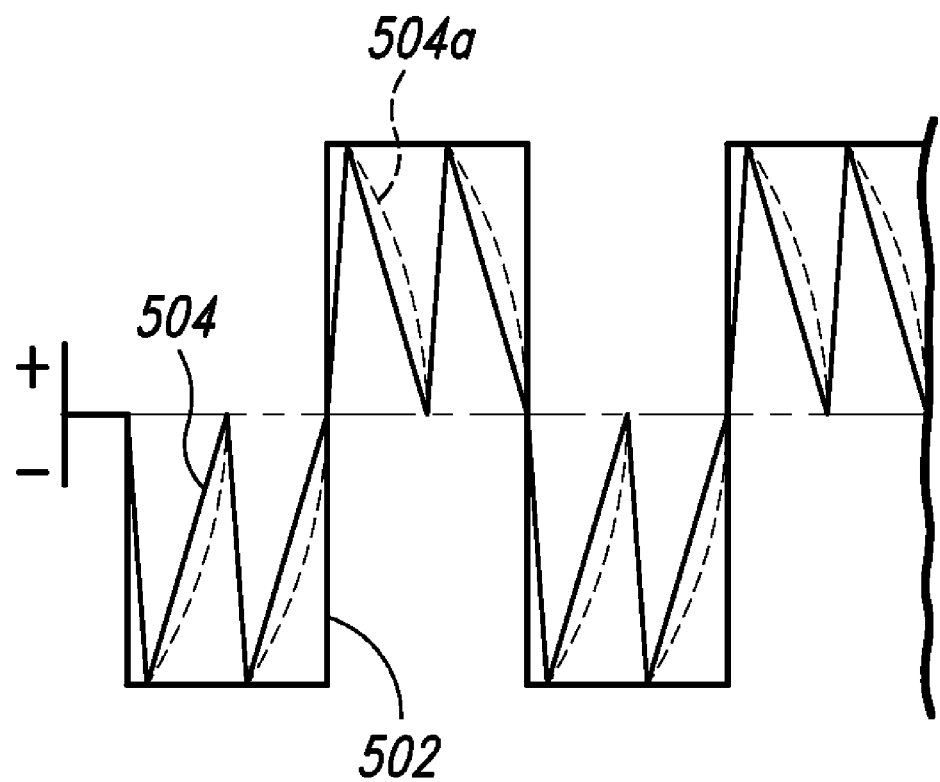
FIG. 5 schematically illustrates a waveform for electrolytically processing a microelectronic substrate in accordance with another embodiment of the invention.

Any of the foregoing apparatuses described above with reference to FIGS. 2-4 can be used to chemically-mechanically process the microelectronic substrate 110, and/or electrochemically-mechanically process the microelectronic substrate 110. When the apparatuses are used to electrochemically-mechanically process the microelectronic substrate 110, they can provide a varying electrical current that passes from the electrodes, through the conductive material of the microelectronic substrate 110, via the electrolytic fluid without contacting the electrodes with the microelectronic substrate 110. For example, as shown in FIG. 5, the apparatus can generate a high-frequency wave 504 and can superimpose a low-frequency wave 502 on the high-frequency wave 504. In one aspect of this embodiment, the high-frequency wave 504 can include a series of positive or negative voltage spikes contained within a square wave envelope defined by the low-frequency wave 502. Each spike of the high-frequency wave 504 can have a relatively steep rise-time slope to transfer charge through the dielectric material to the electrolyte and a more gradual fall-time slope. The fall-time slope can define a straight line, as indicated by high-frequency wave 504, or a curved line, as indicated by high-frequency wave 504a. In other embodiments, the high-frequency wave 504 and the low-frequency wave 502 can have other shapes depending, for example, on the particular characteristics of the dielectric material and the electrolyte, the characteristics of the microelectronic substrate 110, and/or the target rate at which conductive material is to be removed from the microelectronic substrate 110.

From the foregoing, it will be appreciated that specific embodiments of the invention have been described herein for purposes of illustration, but that various modifications may be made without deviating from the spirit and scope of the invention. For example, many of the structures and processes described above in the content of microelectronic containers can also be applied to other microelectronic features. Accordingly, the invention is not limited except as by the appended claims.

We claim:

1. A method for forming microelectronic structures, comprising:

forming an aperture in a borophosphosilicate glass microelectronic substrate material, the aperture extending into the substrate material from a plane of the substrate material;

disposing an underlayer in the aperture, the underlayer including tantalum;

disposing a platinum layer in the aperture adjacent to the underlayer, the platinum layer including a first platinum portion in the aperture and a second platinum portion external to the aperture;

disposing a phosphosilicate glass fill material on the substrate material, the phosphosilicate glass having a first glass portion in the aperture adjacent to the platinum layer and a second glass portion external to the aperture;

recessing the second glass portion inwardly toward the plane of the substrate material relative to the second platinum portion with the recessed second glass portion still projecting beyond the plane of the substrate material; and forming a microelectronic feature in the aperture.

2. The method of claim 1 wherein the method further comprises:

chemically-mechanically polishing the microelectronic substrate to remove at least part of the second glass portion extending beyond the second platinum portion such that the second glass portion is generally flush with the second platinum portion;

thereafter, recessing the second glass portion of the fill material inwardly toward the aperture from the second platinum portion; and electrochemically-mechanically polishing the microelectronic substrate to remove the second platinum portion while the recessed second glass portion projects beyond the plane of the substrate material.

3. The method of claim 1, further comprising removing at least approximately all portions of the underlayer, the platinum layer and the fill material positioned both adjacent to and external to the aperture.

4. A method for processing a microelectronic substrate, comprising:

providing a microelectronic substrate having a substrate material with a substrate material plane, an aperture in the substrate material plane, an underlayer lining the aperture, a platinum layer adjacent to the underlayer, and a phosphosilicate glass fill material disposed in the aperture adjacent to the platinum layer, wherein a portion of the fill material includes a first external portion projecting beyond the aperture, and wherein a portion of the conductive material includes a second external portion projecting beyond the aperture;

chemically-mechanically polishing the microelectronic substrate to remove at least part of the first external portion extending beyond the second external portion such that the first external portion is generally co-planar with respect to the second external portion;

thereafter, recessing the first external portion inwardly toward the aperture relative to the second external portion by etching the first external portion until the first external portion extends by from about 200 Angstroms to about 500 Angstroms beyond the substrate material plane;

removing the second external portion using electrochemical-mechanical polishing while the recessed first external portion projects beyond the substrate material plane by about 200 Angstroms to about 500 Angstroms; and disposing a microelectronic feature in the aperture.

5. The method of claim 4 wherein disposing a microelectronic feature includes disposing an electrode, and wherein the method further comprises removing the fill material from the aperture prior to disposing the electrode in the aperture.

6. The method of claim 4 wherein providing a microelectronic substrate includes providing a microelectronic substrate having an aperture with an aspect ratio of about 4:1 or more.

7. The method of claim 4 wherein disposing a microelectronic feature includes disposing an electrode.

8. The method of claim 4, further comprising making the fill material flush with the substrate material plane by removing portions of the underlayer, the conductive material and the fill material external to the aperture after removing the second external portion of the conductive material.

9. The method of claim 4 wherein providing a microelectronic substrate includes providing a microelectronic substrate with a second external portion projecting by a distance of about 1000 Angstroms beyond the substrate material plane.

10. A method for processing a microelectronic substrate, comprising:
    forming an aperture in a microelectronic substrate material having a substrate material plane;
    disposing an underlayer material in the aperture proximate to a wall of the aperture;
    disposing a conductive material on the underlayer material, the conductive material having a first conductive portion in the aperture and a second conductive portion external to the aperture and projecting beyond the substrate material plane;
    disposing a fill material on the conductive material, the fill material having a first fill portion in the aperture and a second fill portion external to the aperture, the second fill portion projecting beyond the substrate material plane;
    exposing a surface of the second conductive portion of the conductive material by removing a part of the second fill portion, the remaining second fill portion being generally co-planar with the surface of the first conductive portion;
    recessing the remaining second fill portion inwardly toward the substrate material plane relative to the exposed surface of the second conductive portion with the recessed second fill portion projecting beyond the substrate material plane; and
    removing the second conductive portion of the conductive material while the recessed second fill portion projects beyond the substrate material plane.

11. The method of claim 10, further comprising:
    removing a portion of the underlayer material external to the aperture; and
    removing the recessed second fill portion such that the fill material is generally co-planar with the substrate material plane.

12. The method of claim 10 wherein:
    forming an aperture in the microelectronic substrate material includes forming an aperture having an aspect ratio of about 4:1 or more;
    disposing the conductive material includes disposing platinum; and
    disposing the fill material includes disposing phosphosilicate glass.

13. The method of claim 10 wherein disposing a fill material includes disposing a fill material having a hardness of about 6.5 GPa or higher.

14. The method of claim 10 wherein removing the second conductive portion of the conductive material includes removing the second conductive portion of the conductive material via electrochemical-mechanical polishing with the recessed second fill portion projecting beyond the substrate material plane.

15. The method of claim 10 wherein the surface of the second conductive portion projects beyond the substrate material plane for a first distance, and wherein recessing the remaining second fill portion includes selectively etching the second fill portion so that the second fill portion projects beyond the substrate material plane for a second distance that is about 50% to about 80% of the first distance.

16. The method of claim 10 wherein the surface of the second conductive portion projects beyond the substrate material plane for a first distance, and wherein recessing the remaining second fill portion includes selectively etching the second fill portion so that the second fill portion projects beyond the substrate material plane for a second distance of about 200 Angstroms to about 500 Angstroms.

17. The method of claim 10 wherein:
    removing the second conductive portion of the conductive material includes removing the second conductive portion of the conductive material via electrochemical-mechanical polishing with the recessed second fill portion projecting beyond the substrate material plane; and
    the method further includes reducing a likelihood of forming residual deposits of the conductive material around the aperture during the electrochemically-mechanically polishing with the recessed second fill portion.

18. The method of claim 10 wherein:
    removing the second conductive portion of the conductive material includes removing the second conductive portion of the conductive material via electrochemical-mechanical polishing with the recessed second fill portion projecting beyond the substrate material plane; and
    the method further includes supporting the first conductive portion in the aperture during the electrochemical-mechanical polishing with the recessed second fill portion and the first fill portion.

19. The method of claim 10 wherein:
    removing the second conductive portion of the conductive material includes removing the second conductive portion of the conductive material via electrochemical-mechanical polishing with the recessed second fill portion projecting beyond the substrate material plane; and
    the method further includes supporting the first conductive portion in the aperture during the electrochemical-mechanical polishing and reducing a likelihood of forming residual deposits of the conductive material around the aperture during the electrochemically-mechanically polishing with the recessed second fill portion.

20. The method of claim 10 wherein:
    recessing the remaining second fill portion includes recessing the remaining second fill portion inwardly toward the substrate material plane at a recess distance from the exposed surface of the second conductive portion with the recessed second fill portion projecting beyond the substrate material plane;
    removing the second conductive portion of the conductive material includes removing the second conductive portion of the conductive material via electrochemical-mechanical polishing with the recessed second fill portion projecting beyond the substrate material plane; and
    the recess distance is determined based on a likelihood of (1) the conductive material forming a residual deposit around the aperture and (2) an ability of the first fill portion and the recessed second fill portion to provide support to the first conductive portion in the aperture during the electrochemical-mechanical polishing.

\* \* \* \* \*

UNITED STATES PATENT AND TRADEMARK OFFICE
CERTIFICATE OF CORRECTION

PATENT NO. : 8,048,756 B2  Page 1 of 1
APPLICATION NO. : 12/731049
DATED : November 1, 2011
INVENTOR(S) : Whonchee Lee et al.

It is certified that error appears in the above-identified patent and that said Letters Patent is hereby corrected as shown below:

On the face page, in field (54), in "Title", in column 1, line 4, after "INCLUDING" insert -- AN --.

In column 1, line 4, after "INCLUDING" insert -- AN --.

Signed and Sealed this
Tenth Day of January, 2012

David J. Kappos
*Director of the United States Patent and Trademark Office*